(12) United States Patent
Roeth et al.

(10) Patent No.: US 11,594,654 B2
(45) Date of Patent: Feb. 28, 2023

(54) METHOD OF GENERATING A GERMANIUM STRUCTURE AND OPTICAL DEVICE COMPRISING A GERMANIUM STRUCTURE

(71) Applicant: Infineon Technologies AG, Neubiberg (DE)

(72) Inventors: Andre Roeth, Dresden (DE); Henning Feick, Dresden (DE); Heiko Froehlich, Radebeul (DE); Thoralf Kautzsch, Dresden (DE); Olga Khvostikova, Dresden (DE); Stefano Parascandola, Dresden (DE); Thomas Popp, Falkenstein/Gfaell (DE); Maik Stegemann, Freital (DE); Mirko Vogt, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/461,159

(22) Filed: Aug. 30, 2021

(65) Prior Publication Data
US 2022/0069156 A1 Mar. 3, 2022

(30) Foreign Application Priority Data
Aug. 31, 2020 (EP) .................... 20193700

(51) Int. Cl.
*H01L 31/18* (2006.01)
*H01L 21/02* (2006.01)
(Continued)

(52) U.S. Cl.
CPC .... *H01L 31/1808* (2013.01); *H01L 21/02532* (2013.01); *H01L 21/02647* (2013.01);
(Continued)

(58) Field of Classification Search
CPC .......... H01L 31/1808; H01L 21/02532; H01L 21/02647; H01L 31/028; H01L 31/105;
(Continued)

(56) References Cited

U.S. PATENT DOCUMENTS

| 2007/0099315 A1* | 5/2007 | Maa | .................... H01L 31/1808 438/42 |
| 2007/0099329 A1* | 5/2007 | Maa | .................... H01L 31/1808 438/57 |

(Continued)

*Primary Examiner* — Earl N Taylor
(74) *Attorney, Agent, or Firm* — Slater Matsil, LLP

(57) ABSTRACT

A method of generating a germanium structure includes performing an epitaxial depositing process on an assembly of a silicon substrate and an oxide layer, wherein one or more trenches in the oxide layer expose surface portions of the silicon substrate. The epitaxial depositing process includes depositing germanium onto the assembly during a first phase, performing an etch process during a second phase following the first phase in order to remove germanium from the oxide layer, and repeating the first and second phases. A germanium crystal is grown in the trench or trenches. An optical device includes a light-incidence surface formed by a raw textured surface of a germanium structure obtained by an epitaxial depositing process without processing the surface of the germanium structure after the epitaxial process.

16 Claims, 5 Drawing Sheets

(51) Int. Cl.
*H01L 31/105* (2006.01)
*H01L 31/028* (2006.01)
*H01L 31/109* (2006.01)

(52) U.S. Cl.
CPC .......... *H01L 31/028* (2013.01); *H01L 31/105* (2013.01); *H01L 31/109* (2013.01); *H01L 31/1804* (2013.01)

(58) Field of Classification Search
CPC ............... H01L 31/109; H01L 31/1804; H01L 21/02381; H01L 21/0262; H01L 21/02639; Y02P 70/50
See application file for complete search history.

(56) References Cited

U.S. PATENT DOCUMENTS

2011/0049568 A1\* 3/2011 Lochtefeld ........ H01L 21/02381
257/190
2017/0110334 A1\* 4/2017 Kawamoto ....... H01L 21/30625

\* cited by examiner

METHOD OF GENERATING A GERMANIUM STRUCTURE AND OPTICAL DEVICE COMPRISING A GERMANIUM STRUCTURE

This application claims the benefit of European Patent Application No. 20193700, filed on Aug. 31, 2020, which application is hereby incorporated herein by reference.

TECHNICAL FIELD

The present disclosure relates to methods for generating a germanium structure and, in particular, a germanium structure suitable to be used in an optical device. Furthermore, the present disclosure relates to optical devices comprising a germanium structure.

BACKGROUND

Optical devices, such as optical sensors or photovoltaic cells, are widely used. For example, optical sensors, such as miniaturized spectrometer or thermal imaging cameras, are increasingly applied in a plurality of fields, such as in consumer goods or in automotive applications. Generally, such optical devices may convert the electromagnetic energy of light, such as visible or infrared light, into electricity, either to produce energy or to generate a sensor signal.

Silicon is often used as semiconductor material for optical devices, such as optical detectors. Silicon is optically sensitive for light having a wavelength up to 1100 nm. There may be applications for optical devices which permit detection in a larger wavelength range exceeding the wavelength range detectable using silicon as the active material. In particular, in the field of food analytics, of medical technology and of material analytics interesting absorption bands of materials are in a wavelength range up to 1.8 µm.

A material which is suitable for optical detectors due to its properties is germanium. The absorption of germanium is high in the infrared range (NIR=near infrared) up to 1.8 µm. In order to benefit from the lower cost in the silicon semiconductor technology there are approaches to integrate germanium layers with silicon substrates. One of the challenges is to generate a germanium layer on a silicon layer with sufficient quality and within an acceptable time frame. Simply depositing a germanium layer onto a silicon layer may result in dislocations in the germanium layer due to different lattice constants of silicon and germanium, which may affect the electrical performance of the device. Since the costs of germanium exceed the costs of silicon many times using germanium as substrate material is generally not an option.

In order to reduce dislocations in the germanium layer, in a method called Aspect Ratio Trapping (ART) trenches are etched in a layer, such as a silicon oxide layer, which is formed on a silicon layer. The trenches have a high aspect ratio, i.e. the height of the trenches is larger than the width of the trenches. Typically, the height may be three times the width. Germanium is grown in the trench and beyond so that a germanium layer is formed on the silicon oxide layer. It is the object of the Aspect Ratio Trapping that dislocations in the germanium layer "outgrow" in the grown-up germanium layer at the side walls of the trench. Thereby, dislocations in the germanium trench decrease with increasing height. This technique is the basis for depositing pure thick layers of germanium, which are usable for optical applications.

In other approaches, intermediate layers are used when depositing a germanium layer onto a silicon layer in order to reduce dislocations in the germanium layer. Such intermediate layers may be formed of $Si_xGe_y$ with different percentages of germanium from 1% to 100%. The percentage of silicon may be high in the first $Si_xGe_y$ layer deposited onto the silicon substrate and may decrease with increasing distance from the silicon substrate in order to realize a homogeneous transition. Thus, strain in the crystal structure at the transition between silicon and germanium may be reduced and less dislocations are generated which extend into the region of the germanium layer, which is to be functionalized. Such intermediate layers result in longer process times and more complex processes.

In other approaches, cyclic temperature processes are used to reduce dislocations in a transition between silicon and germanium. The temperature processes are performed at temperatures up to 900° C. with up to 10 repetitions. These process steps, which are in addition to the actual deposition of the germanium layer, are cost intensive and increase the complexity of the process. In addition, from a perspective point view, such high temperatures may not be compatible with a monolithic integration of the functional layers with standard CMOS processes.

SUMMARY

It is the purpose of examples of the present disclosure to provide a method of generating a germanium structure usable in an optical device in such a manner that an optical device with a good performance can be achieved by a less complex process. It is the purpose of examples of the present disclosure to provide a corresponding optical device.

Examples of the present disclosure provide a method of generating a germanium structure, in which an assembly comprising a silicon substrate having an oxide layer on a surface thereof is provided. The oxide layer comprises a number of trenches, each trench extending to and exposing a portion of the surface of the silicon substrate. A respective depth of each trench is larger than a respective width of each trench. The number of trenches is at least one, i.e. the oxide layer comprises at least one trench. An epitaxial depositing process is performed on the assembly to grow up a germanium crystal of the germanium structure on each exposed portion of the silicon substrate, each germanium crystal being formed in the associated trench and on regions of the oxide layer adjoining the associated trench. The epitaxial depositing process comprises depositing germanium onto the assembly during a first phase, performing an etch process during a second phase following the first phase in order to remove germanium from the oxide layer, and repeating the first and second phases.

Thus, in examples of the present disclosure, a germanium structure, such as a germanium layer, is formed on a silicon substrate using one or more deep trenches and a specific deposition process. The deposition process permits the silicon crystal(s) to be grown in a fast manner and with a structure that permits using the grown crystal(s) as an active element of an optical device without processing the surface of the germanium structure after the deposition thereof.

Examples of the present disclosure provide an optical device comprising a silicon substrate, an oxide layer on a surface of the silicon substrate, an epitaxially deposited germanium structure on the surface of the silicon substrate, electrical connections to parts of the germanium structure and/or the silicon substrate, and a light incidence surface. The oxide layer comprises a number of trenches extending to the surface of the silicon substrate, wherein a depth of each trench is larger than a width thereof, and wherein the number of the trenches is at least one. The epitaxially deposited germanium structure comprises a germanium crystal in each of the number of trenches and on regions of the oxide layer adjoining each trench. The germanium structure forms at least part of a pn junction or a pin junction between the electrical connections. The light incidence surface is formed by a raw textured surface of the germanium structure which is obtained by an epitaxial depositing process used to generate the epitaxially deposited germanium structure without processing the surface of the germanium structure after the epitaxial depositing process.

Thus, examples of the present disclosure provide a method of generating a germanium structure, which comprises performing an epitaxial depositing process on an assembly of a silicon substrate and an oxide layer, wherein one or more trenches in the oxide layer expose surface portions of the silicon substrate. The epitaxial depositing process comprises depositing germanium onto the assembly during a first phase, performing an etch process during a second phase following the first phase in order to remove germanium from the oxide layer, and repeating the first and second phases. Thus, a germanium crystal is grown up in the trench or each of a plurality of trenches. An optical device includes a light-incidence surface formed by a raw textured surface of a germanium structure obtained by an epitaxial depositing process without processing the surface of the germanium structure after the epitaxial process.

BRIEF DESCRIPTION OF THE DRAWINGS

Examples of the disclosure will be described using the accompanying drawings, in which.

DETAILED DESCRIPTION OF ILLUSTRATIVE EMBODIMENTS

In the following, examples of the present disclosure will be described in detail using the accompanying drawings. It is to be pointed out that the same elements or elements having the same functionality are provided with the same or similar references numbers and that a repeated description of elements provided with the same or similar reference numbers is typically omitted. Hence, descriptions provided for elements having the same or similar reference numbers are mutually exchangeable. In the following description, a plurality of details is set forth to provide a more thorough explanation of examples of the disclosure. However, it will be apparent to one skilled in the art that other examples may be practiced without these specific details. In other instances, well-known structures and devices are shown in block diagram form rather than in detail in order to avoid obscuring examples described herein. In addition, features of the different examples described hereinafter may be combined with each other, unless specifically noted otherwise.

According to examples of the present disclosure, a grown germanium structure may be used as a basis for the production of optical devices, such as photo diodes, on a silicon semiconductor material.

An example of a method for generating a germanium structure according to the present disclosure is now explained referring to FIGS. 1A to 1E.

Figure 1A:
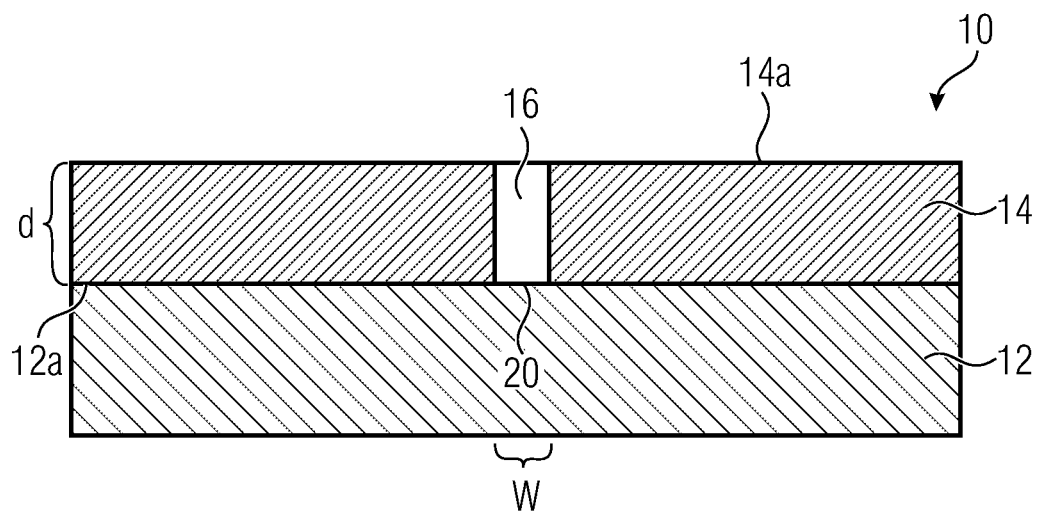
FIGS. 1A to 1E show schematic cross-sectional views of an assembly comprising a silicon substrate and an oxide layer at different times during a deposition process to explain an example of a method according to the present disclosure.

As shown in FIG. 1A, an assembly 10 comprising a silicon substrate 12 and an oxide layer 14 is provided. The oxide layer 14 is provided on a surface 12a of the substrate 12 and comprises a trench 16. The trench 16 extends to the surface 12a of the substrate 12 so that a surface portion 20 of the substrate 12 is exposed. Oxide layer 14 may be a SiO layer.

The depth d of the trench 16 is larger than the width w of the trench 16. The depth of the trench 16 is the dimension of the trench 16 in a vertical direction perpendicular to the substrate plane, wherein the substrate plane may be defined by the main surface 12a of the substrate, on which the oxide layer is provided. The width w of the trench is a (maximum) dimension of the trench between opposing side walls of the trench in a direction perpendicular to the vertical direction. In case the trench is circular when viewed in the vertical direction the width of the trench is the diameter of the trench. In case the trench is square-shaped when viewed in the vertical direction, the width of the trench corresponds to the side length of the square. In case the trench is elongate when viewed in the vertical direction, the width is the distance between the two longer sides, while the distance between the two shorter sides is the length of the trench. In other words, in case of an elongate trench, the width of the trench is shorter than the length of the trench.

In examples, the ratio between the trench depth and the trench width is at least two or at least three. In examples, the ratio between the trench depth and the trench width is three. Thus, in examples strain/dislocations in a germanium crystal which is grown in the trench can be reduced in a reliable manner.

In examples, the trench diameter or width, i.e. critical dimension, of the trench may be in the range from 100 nm to 2000 nm. In examples, in which the intention is that germanium crystals grow together, the distance between trenches may be in the range from 500 nm to 5000 nm. In other examples, the distance between trenches is not critical.

Figure 2:
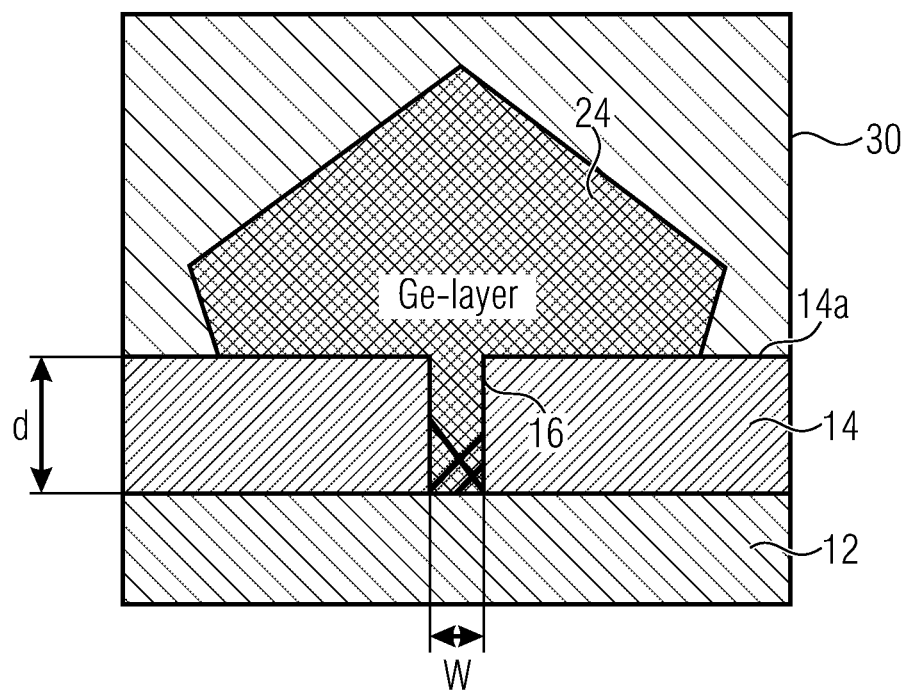
FIG. 2 shows a schematic cross-sectional view of an example of a germanium structure formed by an example of a method according to the present disclosure.

In examples, a germanium structure generated using a single trench, such as the structure shown in FIG. 2, may have a height in the range from 0.3 μM to 10 μM and a width/length of 0.3 μM to 9 μm. For germanium structures generated using more than one trench, i.e. when germanium structures formed in more than one trench grow together, the dimensions may be correspondingly higher.

In examples, providing assembly 10 may comprise forming trench 16 in the oxide layer. Forming trench 16 may include etching trench 16 into oxide layer 14. Thus, surface portion 20 is exposed.

While a single trench 16 is shown in FIG. 1A, a plurality of corresponding trenches, such as a row of at least two trenches or a two-dimensional array of at least four trenches, may be formed in the oxide layer. The preceding and following description with respect to one trench herein equally applies for each trench if the number of trenches is larger than one.

An epitaxial depositing process is performed in order to generate a germanium structure in the form of a germanium crystal on the assembly shown in FIG. 1A. The germanium crystal may be substantially monocrystalline with few dislocations, in particular in a region thereof distant from the silicon substrate on which it is grown.

In examples, the epitaxial deposition process changes between depositing and etching the same material, i.e. germanium. Thus, growth of polycrystalline grains on the surface of the wafer, i.e. the oxide surface, can be suppressed effectively while germanium structures as described herein are generated. The generated germanium structures may then be functionalized. In the epitaxial deposition process, germanium is deposited onto the top surface of the assembly 10 during a first phase and etching germanium is performed during a second phase. The first phase and the second phase take place one after the other and not concurrently. The first phase and the second phase are repeated multiple times in order to generate the germanium structure on the assembly 10.

In examples, a duration of the first phase is longer than a duration of the second phase. In examples, the duration of the first phase is at least two times or at least three times the duration of the second phase. Thus, the germanium structure may be generated in a time efficient manner. In examples, the germanium structure may be formed within a time frame of 30 to 60 minutes.

In examples, the epitaxial deposition process is performed at temperatures not exceeding 600° C. In examples, the temperature is controlled during the first and second phases to a temperature in a range of 300 C to 650° C., preferably in a range of 590° C. to 610° C. In other examples, the temperature may be controlled to be in a range of 300° C. to 400° C. Thus, examples permit performing the process at temperatures that permit a monolithic integration of the generated functional layers with standard CMOS processes. In examples, 1% GeH4 in hydrogen may be used to achieve germanium deposition in the first phase. In examples, hydrochloric acid may be used for etching in the second phase. In examples, flow rates during the first and second phases are adapted to permit growing of the germanium crystal in a time-efficient manner. In examples, a flow rate of 1% GeH4 in hydrogen is controlled during the first phases to be in a range of 350 sccm to 450 sccm, preferably in a range of 390 sccm to 410 sccm. In examples, a flow rate of hydrochloric acid is controlled during the second phases to be in a range of 40 sccm to 55 sccm, preferably in a range of 45 sccm to 49 sccm.

In examples, the duration of the first phases may be in the order of 5 s to 15 s and the duration of the second phases may be in the order of 1 s to 5 s. In examples, the number of cycles, i.e. repetitions of the first phase and the second phase, may be 100 or more.

In examples, if native $SiO_2$ is present on surface portion 20, providing assembly 10 may comprise removing native $SiO_2$ from the ground of trench 16, i.e. from surface portion 20, before depositing germanium onto substrate portion 22 is started. In examples, removing native $SiO_2$ from the ground of trench 16 comprises baking the silicon substrate at a temperature in a range of 950° C. to 1150° C., preferably in a range of 1040° C. to 1060° C., at a hydrogen flow in a range of 15 to 25 slm, preferably 19 to 21 slm, for a duration in a range of 120 to 240 s, preferably in a range of 145 s to 155 s. By such a treatment, $SiO_2$ may be reduced to SiO, which is finally vaporized at the high temperature. In other examples, removing native $SiO_2$ may comprise performing a wet etch process before the baking process. (The wet etch may take place at room temperature or at 35° C., wherein the temperature at which the wet etch takes place is not critical). This wet etch process option allows to lower the temperature of the baking process to 850° C. This permits removing the native $SiO_2$ at a reduced temperature when compared to the baking process without a wet etch.

In a specific example, the germanium structure may be generated using the following parameters at a pressure of 133.3 hPa in both the first and second phases, which may be repeated 126 times. First phase: duration 10 s, 400 sccm of 1% $GeH_4$ in hydrogen, temperature 600° C. Second phase: duration 3 s, 47 sccm hydrochloric acid, temperature 600° C. In the specific example, a high temperature baking process at 1050° C. at a hydrogen flow of 20 slm for a duration of 150 s may be performed prior to the epitaxial deposition process in order to remove native $SiO_2$ on the silicon surface on which the germanium structure is grown.

Figure 1B:
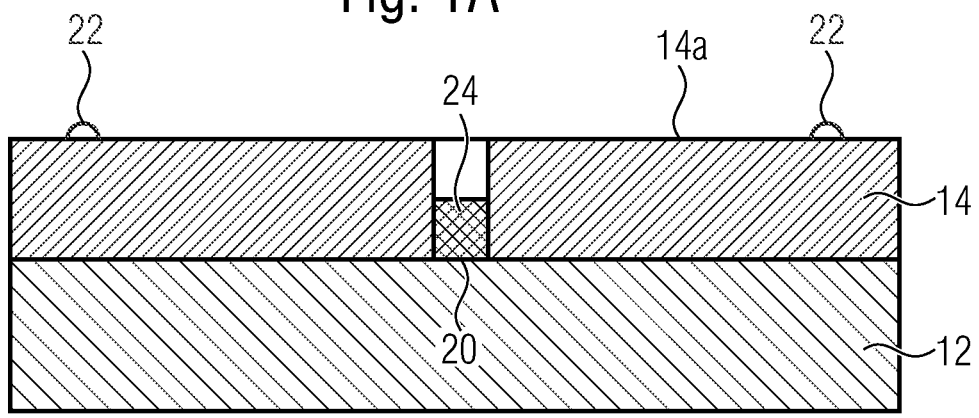
Figure 1C:
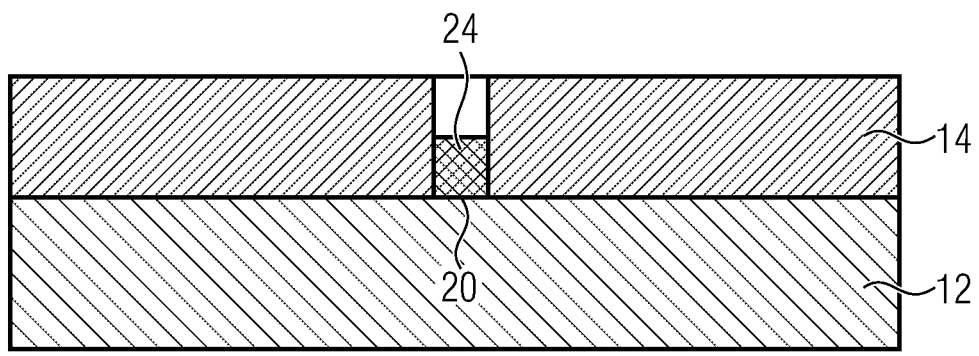

The epitaxial deposition of the germanium layer is a selective process. That means that in principle the growth should just take place in the trench on the silicon surface. However, due to surface roughness or other reasons at certain areas on the silicon oxide surface germanium grows in polycrystalline structures. This does not happen on the whole surface. Generally, the growth is limited to a few polycrystalline germanium grains on the oxide surface. FIG. 1B schematically shows the assembly 10 after a first phase, wherein a germanium crystal 24 is grown onto the ground of trench 16, i.e., on surface portion 20 of substrate 12. In addition, FIG. 1B schematically shows polycrystalline grains 22 formed on the surface 14a of the oxide layer 14. FIG. 1C shows the assembly 10 after a next second phase in which polycrystalline grains 22 are removed.

Figure 1D:
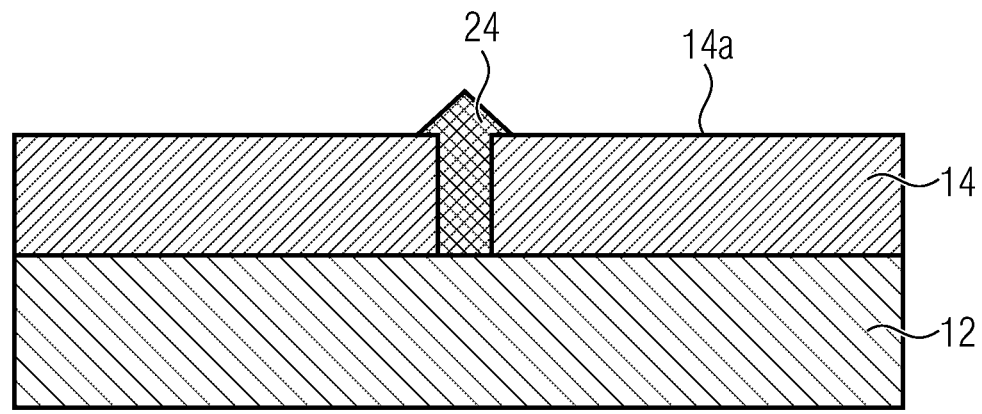
Figure 1E:
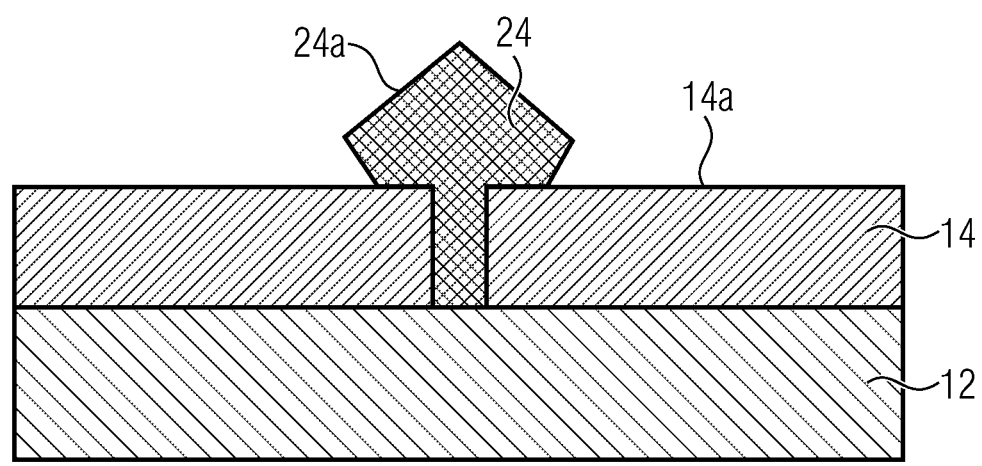

FIG. 1D shows the assembly in a state in which the growing germanium crystal reached the top surface 14a of the oxide layer 14, such as after a number of repetitions of the first and second phases. When reaching surface 14a, the germanium crystal starts growing in the lateral direction in addition to growing in the vertical direction. Thus, the germanium crystal is formed in and on trench 16 and on regions of the oxide layer adjoining trench 16, such as regions of the oxide layer surrounding the trench 16. FIG. 1E shows the assembly after finishing the epitaxial deposition process. A bigger part of the germanium crystal may rest on the oxide layer surrounding the trench. In the example shown, the grown germanium crystal has a pyramid shape. This is the form of the germanium crystal as grown without any further processing thereof. Top surfaces 24a of the germanium crystal are arranged with an angle therebetween.

Thus, the grown germanium crystal comprises a raw textured surface which may be used as a light incidence surface without any further processing of the germanium crystal. In examples, a pyramid shape of the germanium crystal may be obtained when the germanium crystal is grown on a base material having a 100 orientation. In other examples, base material having another orientation may be used and a germanium crystal having a raw textured surface with a different shape may be obtained by the epitaxial deposition process. In examples, the textured surface of the germanium structure obtained by the epitaxial depositing process is maintained and may be functionalized in order to be used as an active region of an optical device.

In examples, more than one trench is formed in the oxide layer and germanium crystals grow in all trenches at the same time using the same deposition process. In examples, the trenches may comprise a first trench and a second trench, wherein the germanium crystals formed on regions of the oxide layer adjoining the first and second trenches touch each other. In other words, the germanium crystals grown in the first and second trenches may grow together and may form a continuous germanium structure. In examples, a two-dimensional raster of trenches may be provided, wherein the germanium crystals associated with the trenches form a continuous germanium layer. In other words, a plurality of trenches may be provided with such a distance between adjacent trenches that germanium crystals grown in adjacent trenches grow together and form a continuous germanium structure. The distance between adjacent trenches may be adapted so that a raw textured surface, such as a surface comprising pyramid shaped projections, is formed by the epitaxial deposition process. Thus, larger germanium structures, such as layers, having a raw textured surface may be formed.

FIG. 2 shows the germanium structure in the form of the grown crystal 24 on the assembly comprising the silicon substrate 12 and the silicon oxide 14. Inclined lines in trench 16 in FIG. 2 and other Figures are to indicate that dislocations in the grown-up germanium layer "outgrow" at the side walls of the trench. In examples, a protective layer is applied onto the germanium structure without conducting any planarization of the germanium structure before applying the protective layer. FIG. 2 shows a protective layer 30 formed on the top surface 14a of the oxide layer 14 and the germanium crystal 24. The protective layer may be an oxide layer, such as a silicon oxide layer. Examples comprise applying a protective layer onto the germanium structure without conducting any planarization of the germanium structure before applying the protective layer. The protective layer may provide a planar upper surface which may form the starting point for further processing, such as further processing to accomplish an optical device. In examples, a chemical mechanical polishing process may be performed with respect to the protective layer to achieve a planar upper surface of the protective layer.

In examples, the germanium structure is functionalized, i.e. measures are taken that make the generated germanium structure suitable to be used as an active area in an optical device, such as a photodiode. In examples, the germanium structure is functionalized to be used as the active area to catch incident light and to convert the incident light into electric energy. In examples, at least parts of the silicon substrate and/or the germanium structure are doped so that a pn junction or a pin junction is formed by the silicon substrate and the germanium structure. In examples, dopants are added during and/or between at least a part of the first phases so as to generate doped regions of the germanium crystal. Thus, in examples in-situ doping of a pn junction or a pin junction make take place between and/or during respective deposition phases. The doping may be introduced at a desired spatial position within the crystal. In examples, at least regions of the silicon substrate to which the number of trenches extend are doped. Regions of the silicon substrate to which different trenches of the number of trenches extend may be doped by the same doping type or different doping types.

Figure 3:
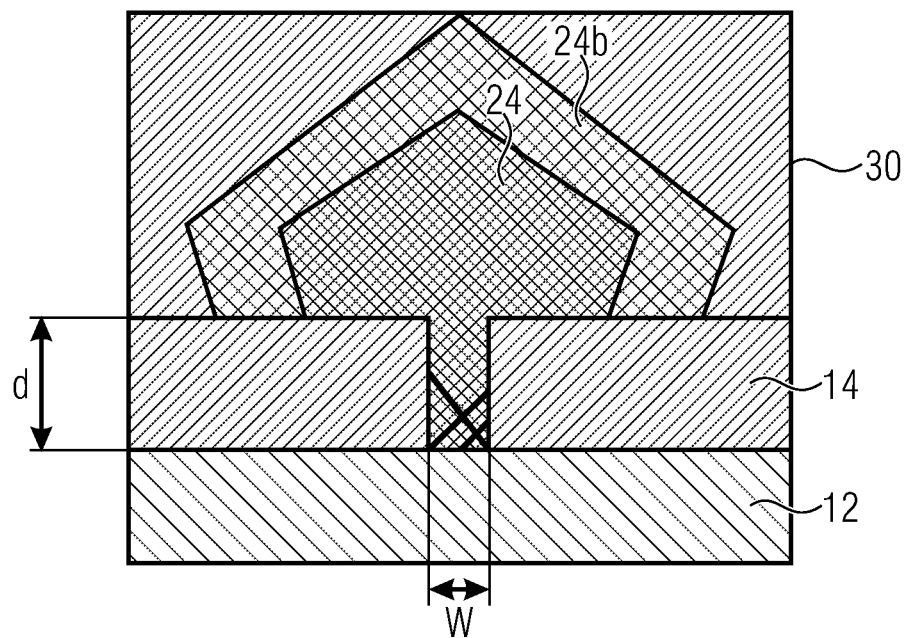
FIG. 3 shows a schematic cross-sectional view of an example of a germanium structure formed by another example of a method according to the present disclosure.

FIG. 3 shows an example of a generated germanium structure 24, wherein an upper portion 24b of the germanium structure represents an in-situ doped germanium layer. To achieve the structure shown in FIG. 3, in-situ doping may take place during or after the last deposition phases of the epitaxial deposition process.

Examples of the present disclosure comprise forming electrical connections to parts of the germanium structure and/or the silicon substrate so as to generate a sensor element capable of converting incident light into an electrical signal. By doing so, the germanium structure may be functionalized to be used as an active area in an optical device.

Examples of the present disclosure provide an optical device which may be formed using one of the methods described herein. The optical device comprises an epitaxially deposited germanium structure which is generated using one or more trenches in an oxide layer. The upper surface of the germanium structure is a raw textured surface which is directly formed by the deposition process and is used as a light incidence surface without further processing the germanium structure. In other words, the shape of the upper surface of the germanium structure is not changed after the deposition process but is used as it is as a light incidence surface of the optical device.

In examples of such an optical device, a protective layer is formed over the silicon substrate and the germanium structure, the protective layer forming a planar surface facing away from the silicon substrate. In examples of the optical device, the protective layer comprises silicon oxide. In examples of the optical device, at least a portion of the silicon substrate adjoining the or each germanium crystal is doped with a first doping type, wherein at least a portion of the germanium structure is doped with a second doping type different from the first doping type, wherein a first electrical connection of the electrical connections is connected to the silicon substrate and a second electrical connection of the electrical connections is connected to the germanium structure. Examples of the optical device comprise at least a first trench and a second trench, wherein the germanium crystals formed on regions of the oxide layer adjoining the first and second trenches touch each other, wherein a first portion of the silicon substrate adjoining the germanium crystal in the first trench is doped with a first doping type, wherein a second portion of the silicon substrate adjoining the germanium crystal in the second trench is doped with a second doping type different from the first doping type, wherein a first electrical connection of the electrical connections is connected to the first portion of the silicon substrate and a second electrical connection of the electrical connections is connected to the second portion of the silicon substrate. In examples of the optical device, the orientation of the surface of the silicon substrate on which the germanium structure is formed is <100>, wherein the raw textured surface comprises a pyramid shape associated with each germanium crystal.

Figure 4:
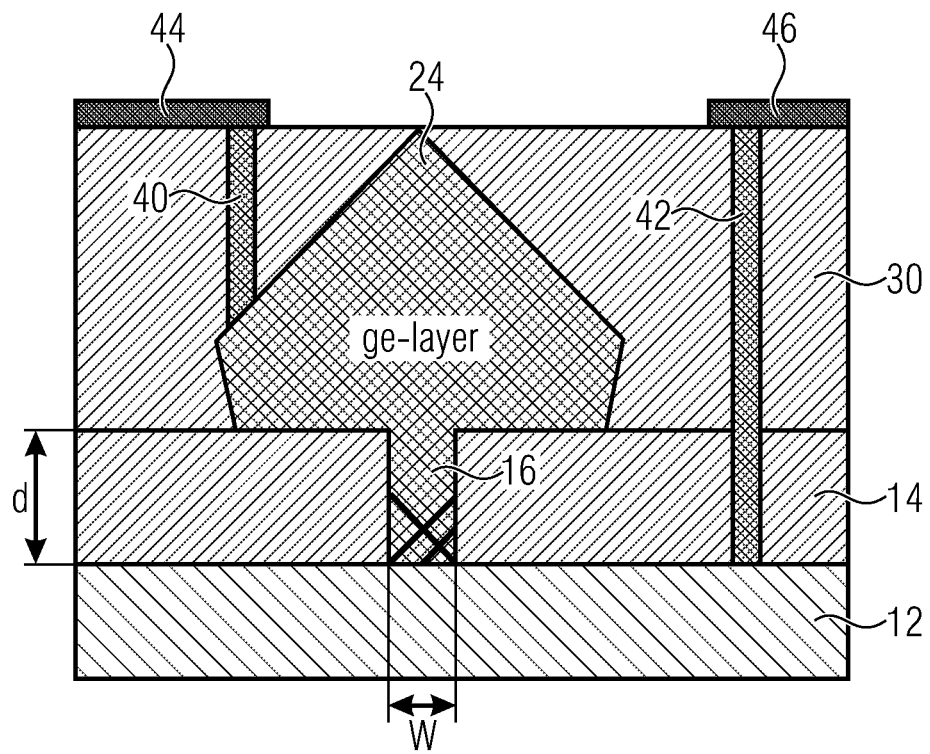
FIG. 4 shows a schematic cross-sectional view of an example of an optical device having electrical connections.

FIG. 4 shows an example of an optical device based on the structure shown in FIG. 2. A first electrical connection 40 is connected to the germanium structure 24 and a second electrical connection 42 is connected to silicon substrate 12. Electrical connections 40 and 42 may be formed by vias through oxide layers 14 and 30. Electrical connections 40 and 42 are further connected to conductive structures 44 and 46, which may connect connections 40 and 42 to a processing circuitry. In examples, conductive structures 44 and 46 may be part of a metallization layer of a CMOS structure including the processing circuitry. In the example shown in FIG. 4, germanium structure 24 may be doped with a first doping type and silicon substrate 12 may be doped with a second doping type so that a pn junction is formed between germanium structure 24 and silicon substrate 12. The upper pyramid shaped surface of germanium structure 24 forms a light incidence surface of the optical device and germanium structure 24 forms an active area for converting incident light into electric energy.

Figure 5:
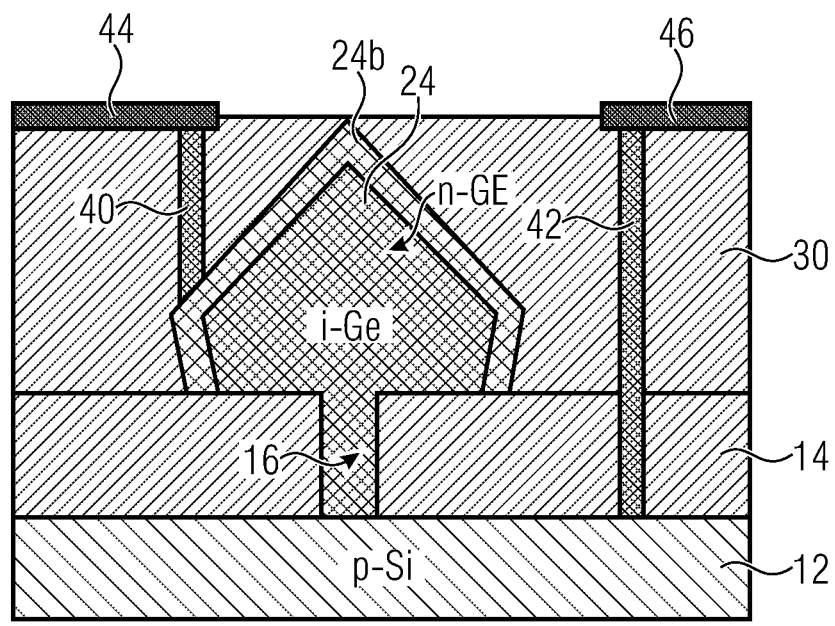
FIG. 5 shows a schematic cross-sectional view of an example of an optical device having a germanium structure with an intrinsic region and a doped region.

FIG. 5 shows an example of an optical device based on the structure shown in FIG. 3. Like in FIG. 4, a first electrical connection 40 in form of a via connects germanium structure 24 to conductive structure 44 and a second electrical connection 42 connects silicon substrate 12 to conductive structure 46. Germanium structure 24 comprises an in-situ doped layer 24b, which is of the n type. The rest of germanium structure 24 is intrinsic. Silicon substrate 12 is of the p type. Thus, a pin junction is formed between germanium structure 24 and silicon substrate 12. Of course, in other examples, the doping types may be changed and germanium layer 24b may be of the p type and silicon substrate 12 may be of the n type. The upper pyramid shaped surface of germanium structure 24 forms a light incidence surface of the optical device and the intrinsic part of the germanium structure 24 forms an active area for converting incident light into electric energy.

Figure 6:
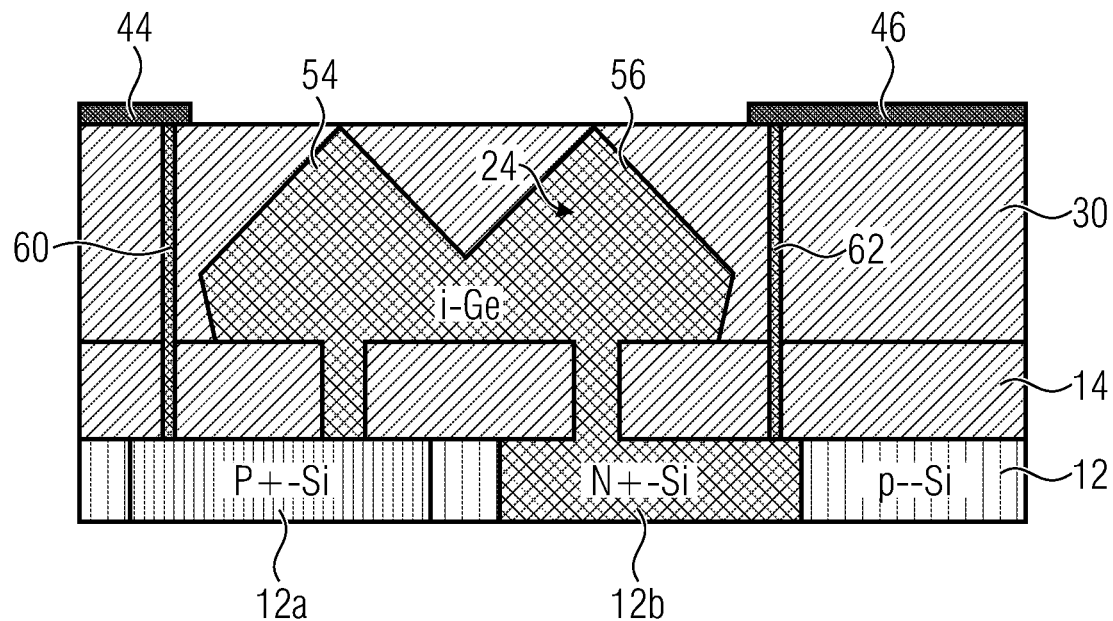
FIG. 6 shows a schematic cross-sectional view of an example of an optical device having a germanium structure formed using more than one trench.
Figure 7:
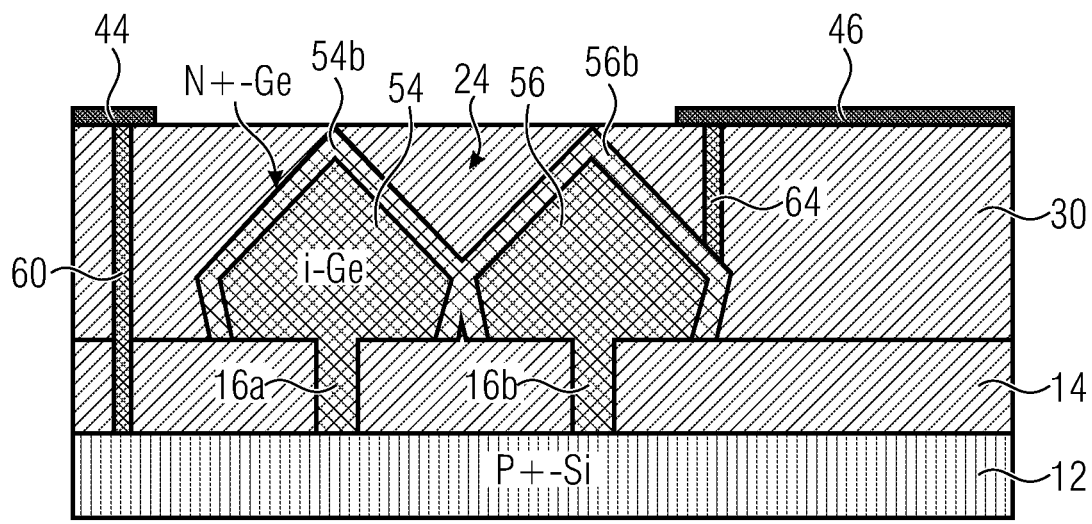
FIG. 7 shows a schematic cross-sectional view of another example of an optical device having a germanium structure formed using more than one trench.

FIGS. 6 and 7 show examples of optical devices in which the germanium structure is formed using two trenches 16a and 16b. A germanium crystal 54 grown using trench 16a and a germanium crystal 56 grown using trench 10 are grown together in the lateral direction to form a continuous germanium structure 24. As shown in FIGS. 6 and 7, an upper surface of germanium structure 24 comprises pyramid shaped protrusions, one associated with each germanium crystal 54 and 56. Thus, the upper surface is a textured surface forming a light incidence surface of the optical device.

In the example of FIG. 6, silicon substrate 12 is a p–substrate. A p+ region 12a and a n+ region 12b are formed in silicon substrate 12. The p+ region 12a is formed under trench 16a and n+ region 12b is formed under trench 16b. Germanium structure 24 is of the intrinsic type. A first electrical connection 60 in form of a via connects p+ region 12a to a conductive structure 44 and a second electrical connection 62 connects n+ region 12b to a conductive structure 46. A pin junction is formed by regions 12a, 12b and germanium structure 24.

In the example of FIG. 7, silicon substrate 12 or at least portions of the silicon substrate under trenches 16a and 16b is or are of the p+ type. Germaniums crystals 54 and 56 comprise respective n+ doped germanium layers 54b and 56b, which may be in-situ doped as described above referring to FIG. 3. A first electrical connection 60 connects silicon substrate 12 to a conductive structure 44 and a second electrical connection 64 connects germanium structure 24 to a conductive structure 46. A pin junction is formed by the p+ silicon substrate 12, the intrinsic portions of the germanium structure and the n+ doped germanium layers.

In the optical devices shown in FIGS. 6 and 7, the intrinsic parts of the germanium structure form an active area for converting incident light into electric energy.

As shown in FIGS. 4 to 7, protection layer 30 may form a planar upper surface on which further circuit structures, such as wiring structures in the form of conductive structures 44 and 46 may be formed.

Examples of the present disclosure permit the generation of high quality germanium structures using the Aspect Ratio Trapping (ART) technology on silicon substrates. Parts of the germanium structure at desired spatial positions may be in-situ doped during the generation of the germanium structure. The resulting shape of the germanium structure allows the conclusion that the germanium structure has a monocrystalline character with few dislocations in particular in a part thereof facing away from the silicon substrate. A protective layer, such as formed of SiO, having a sufficient thickness to compensate for the uneven surface after the generation of the germanium structure may be applied. The protective layer may finally encase the grown germanium structure. A CMP (chemical mechanical polishing) process may be used to planarize the upper surface of the protective layer (without changing the shape of the grown germanium structure).

Examples of the disclosure are based on the idea of using a germanium structure, such as a germanium layer or a layer consisting in part of germanium, which is grown onto a semiconductor substrate, such as a silicon substrate, directly as a structure for implementing an optical device, i.e. without further processing the germanium structure to amend the shape thereof. The grown germanium crystal may be used in the optical device in the form as it is originally grown. In case of a substrate having a 100 orientation, the upper surface of the generated germanium structure may have one or more pyramid shaped protrusions suitable to redirect incident light efficiently into the active area. In other words, in examples, germanium pyramids are utilized to fabricate devices directly in the germanium crystal with the possibility to monolithically integrate such devices with CMOS processes.

In examples, a pn or pin junction may be generated in-situ during the deposition process, i.e., growing process. A thick oxide layer may be deposited as a protective layer to enclose and stabilize the germanium structure. Any topology on the upper surface of the protective layer may be planarized using a CMP process. Electrical connections to the germanium structure and/or the substrate may be implemented using standard materials and signals may be tapped via the substrate material or through the oxide layer on which most of the germanium structure rests. Conductive material may be applied as appropriate, such as on the oxide layer on which part of the germanium structure rests, prior to generating the germanium structure so as to directly connect the germanium structure to such conductive material.

Examples of the present disclosure provide the possibility of a monolithic integration with other circuit structures, such as CMOS structures or an ASIC, application specific integrated circuit since the temperature at which the germanium is deposited may be compatible with those of CMOS or ASIC processes. In examples, the temperature at which the germanium structure is deposited may vary, wherein germanium deposition is possible at temperatures below 400° C.

In examples, functionalized crystals and germanium structures may be combined individually or in groups, such as pixel, to obtain a sensor array, such as to implement a thermographic sensor. Examples of the optical device according to the present disclosure may be used as an optical time of flight sensor, as an optical detector for LIDAR, light detection and ranging, as a spectrometer, as a multichannel spectrometer or as an optical detector for RF applications.

Examples of the present disclosure permit optical devices usable for a large range of wavelengths since germanium offers an optical sensitivity up to 1.8 μm where absorption bands for different substances can be found, for example in food analysis, medical technology and material analysis. Thus, examples may improve optical applications, such as multichannel spectrometers or TOF sensors, which may profit substantially from the extended wavelength range.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus, the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

The above described examples are merely illustrative for the principles of the present disclosure. It is understood that modifications and variations of the arrangements and the details described herein will be apparent to others skilled in the art. It is the intent, therefore, to be limited only by the scope of the pending patent claims and not by the specific details presented by way of description and explanation of the examples herein.

What is claimed is:

1. A method of generating a germanium structure, the method comprising:
   providing an assembly comprising a silicon substrate having an oxide layer on a surface thereof, wherein the oxide layer comprises a number of trenches, each trench extending to and exposing a portion of the surface of the silicon substrate, wherein a trench depth is larger than a trench width, the number of trenches being at least one;
   performing an epitaxial depositing process on the assembly to grow up a germanium crystal of the germanium structure on each exposed portion of the silicon substrate, each germanium crystal being formed in an associated trench and on regions of the oxide layer adjoining the associated trench, wherein the epitaxial depositing process comprises:
   depositing germanium onto the assembly during a first phase;
   performing an etch process during a second phase following the first phase in order to remove germanium from the oxide layer; and
   repeating the first and second phases,
   wherein a duration of the first phase is longer than a duration of the second phase.

2. The method of claim 1, further comprising controlling the first and second phases to a temperature in a range of 300° C. to 650° C.

3. The method of claim 1, comprising controlling a flow rate of 1% $GeH_4$ in hydrogen during the first phases to be in a range of 350 sccm to 450 sccm.

4. The method of claim 1, wherein at least parts of the silicon substrate and/or the germanium structure are doped so that a pn junction or a pin junction is formed by the silicon substrate and the germanium structure.

5. The method of claim 4, comprising adding dopants during and/or between at least a part of the first phases so as to generate doped regions of the germanium crystal.

6. The method of claim 4, wherein at least regions of the silicon substrate to which the number of trenches extend are doped, wherein regions of the silicon substrate to which different trenches of the number of trenches extend are doped by the same doping type or different doping types.

7. The method of claim 1, wherein a textured surface of the germanium structure obtained by the epitaxial depositing process is maintained.

8. The method of claim 1, further comprising forming at least one electrical connection to at least one part of the germanium structure and/or the silicon substrate so as to generate a sensor element capable of converting incident light into an electrical signal.

9. An optical device comprising:
   a silicon substrate;
   an oxide layer on a surface of the silicon substrate, wherein the oxide layer comprises a number of trenches extending to the surface of the silicon substrate, wherein a trench depth is larger than a trench width, the number of trenches being at least one;
   an epitaxially deposited germanium structure on the surface of the silicon substrate, wherein the germanium structure comprises a germanium crystal in each of the number of trenches and on regions of the oxide layer adjoining each trench;
   at least one electrical connection to at least one part of the germanium structure and/or the silicon substrate, wherein the germanium structure forms at least part of a pn junction or a pin junction between the at least one electrical connection; and
   a light incidence surface formed by a raw textured surface of the germanium structure which is obtained by an epitaxial depositing process used to generate the epitaxially deposited germanium structure without processing the surface of the germanium structure after the epitaxial depositing process,
   wherein the epitaxial depositing process comprises depositing germanium during a first phase, performing an etch process during a second phase following the first phase in order to remove germanium from the oxide layer, and repeating the first and second phases so that a germanium crystal is grown in the trench or each of the number of trenches, and
   wherein the number of trenches comprise at least a first trench and a second trench, wherein the germanium crystals formed on regions of the oxide layer adjoining the first and second trenches touch each other, wherein a first portion of the silicon substrate adjoining the germanium crystal in the first trench is doped with a first doping type, wherein a second portion of the silicon substrate adjoining the germanium crystal in the second trench is doped with a second doping type different from the first doping type, wherein a first electrical connection of the at least one electrical connection is connected to the first portion of the silicon substrate and a second electrical connection of the at least one electrical connection is connected to the second portion of the silicon substrate.

10. The optical device of claim 9, further comprising a protective layer, such as silicon oxide, formed over the silicon substrate and the germanium structure, the protective layer forming a planar surface facing away from the silicon substrate.

11. The optical device of claim 9, wherein at least a portion of the silicon substrate adjoining the or each germanium crystal is doped with a first doping type, wherein at least a portion of the germanium structure is doped with a second doping type different from the first doping type, wherein a first electrical connection of the at least one electrical connection is connected to the silicon substrate and a second electrical connection of the at least one electrical connection is connected to the germanium structure.

12. The optical device of claim 9, wherein the orientation of the surface of the silicon substrate on which the germanium structure is formed is <100>, wherein the raw textured surface comprises a pyramid shape associated with the or each germanium crystal.

13. A method of generating a germanium structure, the method comprising:
   providing an assembly comprising a silicon substrate having an oxide layer on a surface thereof, wherein the oxide layer comprises a number of trenches, each trench extending to and exposing a portion of the surface of the silicon substrate, wherein a trench depth is larger than a trench width, the number of trenches being at least one;
   performing an epitaxial depositing process on the assembly to grow up a germanium crystal of the germanium structure on each exposed portion of the silicon substrate, each germanium crystal being formed in an associated trench and on regions of the oxide layer adjoining the associated trench, wherein the epitaxial depositing process comprises:
   depositing germanium onto the assembly during a first phase;
   performing an etch process during a second phase following the first phase in order to remove germanium from the oxide layer;
   repeating the first and second phases; and
   removing native SiO$_2$ from a surface portion of each trench of the number of trenches before an initial first phase.

14. The method of claim 13, wherein removing native SiO$_2$ from the surface portion of each trench comprises:
   a) baking the silicon substrate at a temperature in a range of 950° C. to 1150° C., or
   b) performing a wet etch process.

15. A method of generating a germanium structure, the method comprising:
   providing an assembly comprising a silicon substrate having an oxide layer on a surface thereof, wherein the oxide layer comprises a number of trenches, each trench extending to and exposing a portion of the surface of the silicon substrate, wherein a trench depth is larger than a trench width, the number of trenches being at least one;
   performing an epitaxial depositing process on the assembly to grow up a germanium crystal of the germanium structure on each exposed portion of the silicon substrate, each germanium crystal being formed in an associated trench and on regions of the oxide layer adjoining the associated trench, wherein the epitaxial depositing process comprises:
   depositing germanium onto the assembly during a first phase;
   performing an etch process during a second phase following the first phase in order to remove germanium from the oxide layer; and
   repeating the first and second phases,
   wherein the number of trenches comprise at least a first trench and a second trench,
   wherein the germanium crystals formed on regions of the oxide layer adjoining the first and second trenches touch each other, and/or wherein the number of trenches comprises a two-dimensional raster of trenches, wherein the germanium crystals associated the trenches form a continuous germanium layer.

16. A method of generating a germanium structure, the method comprising:
   providing an assembly comprising a silicon substrate having an oxide layer on a surface thereof, wherein the oxide layer comprises a number of trenches, each trench extending to and exposing a portion of the surface of the silicon substrate, wherein a trench depth is larger than a trench width, the number of trenches being at least one;
   performing an epitaxial depositing process on the assembly to grow up a germanium crystal of the germanium structure on each exposed portion of the silicon substrate, each germanium crystal being formed in an associated trench and on regions of the oxide layer adjoining the associated trench, wherein the epitaxial depositing process comprises:
   depositing germanium onto the assembly during a first phase;
   performing an etch process during a second phase following the first phase in order to remove germanium from the oxide layer;
   repeating the first and second phases; and
   applying a protective layer, such as silicon oxide, onto the germanium structure without conducting any planarization of the germanium structure before applying the protective layer.

* * * * *